US007206618B2

(12) United States Patent
Latto et al.

(10) Patent No.: US 7,206,618 B2
(45) Date of Patent: Apr. 17, 2007

(54) REMOVABLE CUSTOMIZABLE INSERTS AND FACEPLATE FOR ELECTRONIC DEVICES

(75) Inventors: Antonio T. Latto, Portland, OR (US); Isaac A. Simpson, Milwaukie, OR (US); Markus Diebel, San Francisco, CA (US); Paul Bradley, Woodside, CA (US)

(73) Assignee: Intel Corporation, Santa Clara, CA (US)

( * ) Notice: Subject to any disclaimer, the term of this patent is extended or adjusted under 35 U.S.C. 154(b) by 677 days.

(21) Appl. No.: 10/044,613

(22) Filed: Jan. 11, 2002

(65) Prior Publication Data

US 2003/0134613 A1 Jul. 17, 2003

(51) Int. Cl.
*H04M 1/10* (2006.01)
*H04M 1/00* (2006.01)
*H04B 1/38* (2006.01)

(52) U.S. Cl. .................. 455/575.8; 455/90.3; 455/566; 455/575.1; 379/428.01; 379/433.12

(58) Field of Classification Search ................ 455/347, 455/348, 349, 575.1, 575.8, 90.3, 95, 342, 455/550.1, 556.2, 575.6, 344; 379/441, 447, 379/451
See application file for complete search history.

(56) References Cited

U.S. PATENT DOCUMENTS 4,292,481 A * 9/1981 Barnes et al. ............... 379/441
5,113,435 A  5/1992 Chen
5,848,152 A * 12/1998 Slipy et al. ............. 379/433.13
5,982,881 A * 11/1999 Mischenko ............ 379/433.11
6,324,592 B1 * 11/2001 Hindman ....................... 710/3
6,747,578 B1 * 6/2004 Lam et al. ..................... 341/22

FOREIGN PATENT DOCUMENTS

DE   201 01 039    6/2001
DE   201 04 924    10/2001
EP   1 182 850     2/2002

OTHER PUBLICATIONS

New Design; *Fresh New Look*, www.phoneart.com.
Cellular Accessories & Cell Phone Supplies: Headsets & More; *Save The World Face Plate for Nokia*; SunnyCell.com (2000).
Cellular Accessories & Cell Phone Supplies: Headsets & More; *Tiger Face Plate for Nokia*; SunnyCell.com (2000).
Cellular Accessories & Cell Phone Supplies: Headsets & More; *Soccer Face Plate for Nokia*; SunnyCell.com (2000).
Patent Abstracts of Japan, vol. 1999, No. 12, Oct. 29, 1999 & JP 11 177661 (Anetto:KK), Jul. 2, 1999 abstract).

* cited by examiner

*Primary Examiner*—Tony T. Nguyen
(74) *Attorney, Agent, or Firm*—Trop, Pruner & Hu, P.C.

(57) ABSTRACT

A method and apparatus is disclosed for the customization of electronic equipment of which portable audio players, portable disc players, portable digital games and laptop computers are representative. The electronic equipment may be fitted with a substantially transparent faceplate that may cover removable inserts. These inserts may be customizable to provide unique decorative appearances to the electronic equipment upon which they may be fitted. Decorative designs may either be preprinted on the inserts or a user may produce a customized design.

20 Claims, 6 Drawing Sheets

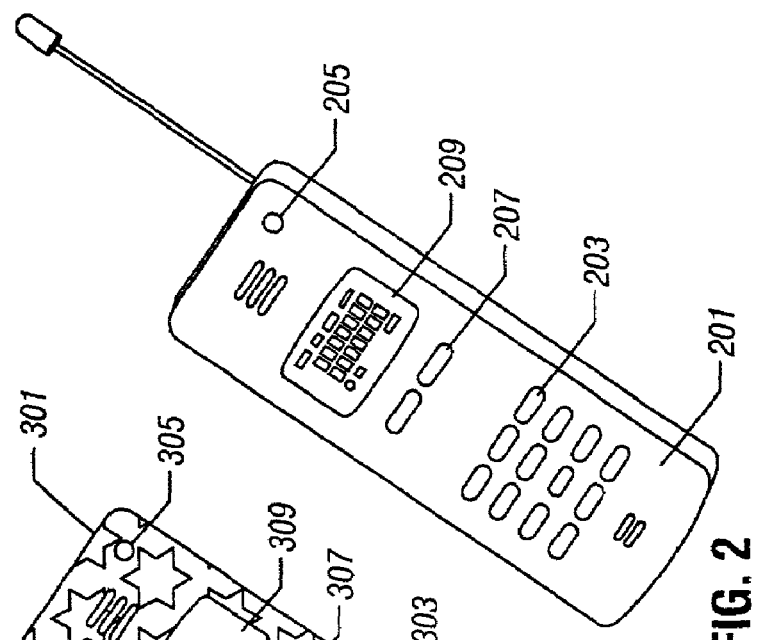
FIG. 2
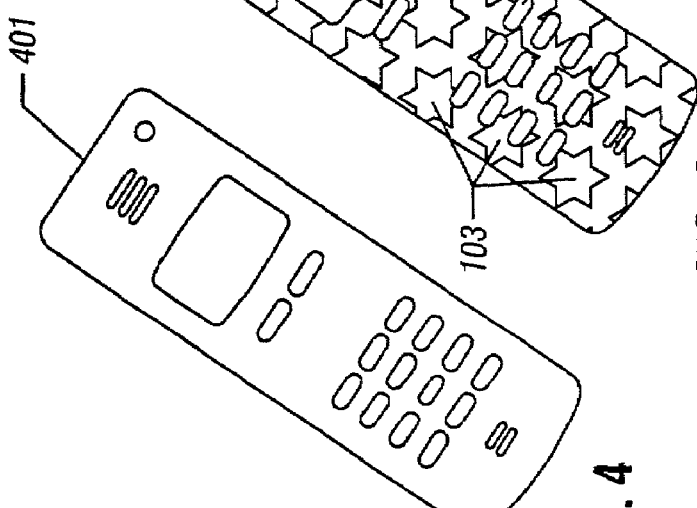
FIG. 3
FIG. 4
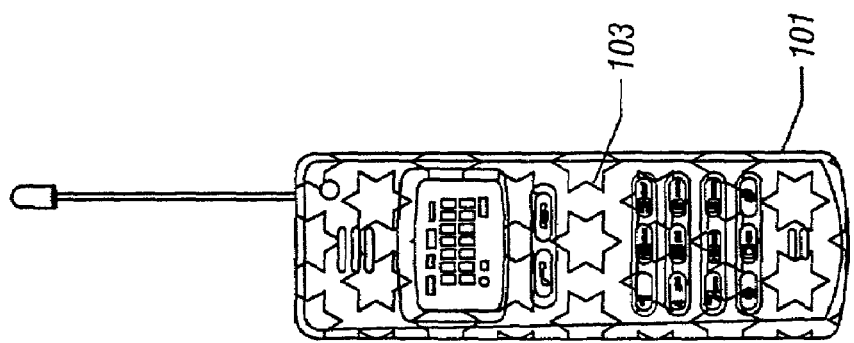
FIG. 1

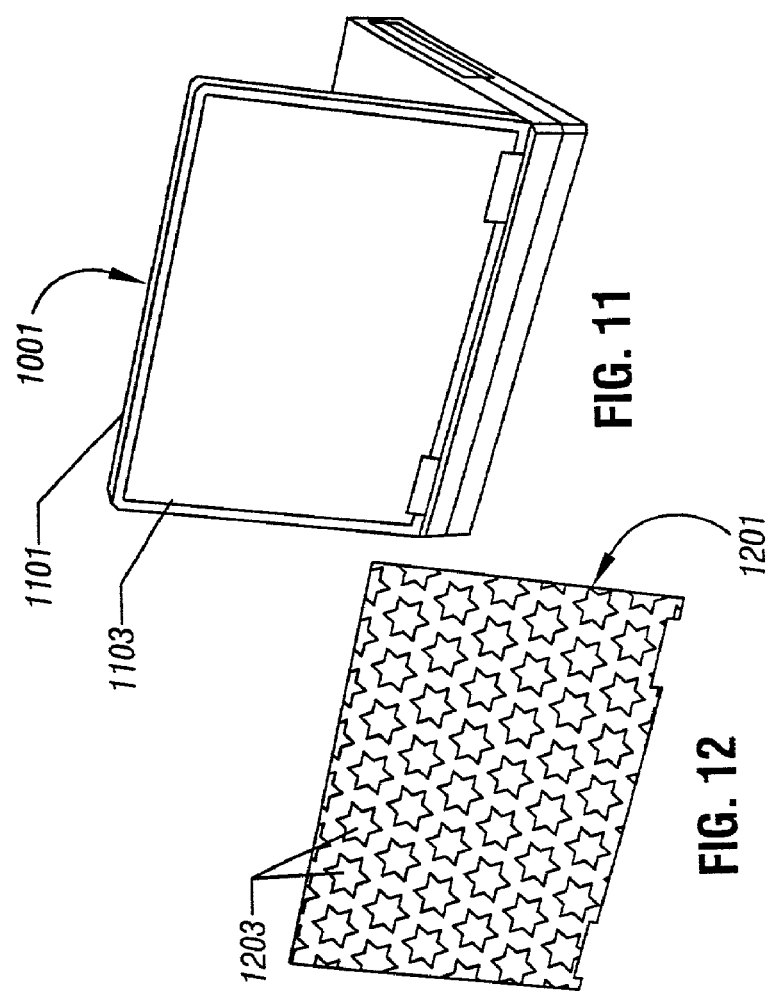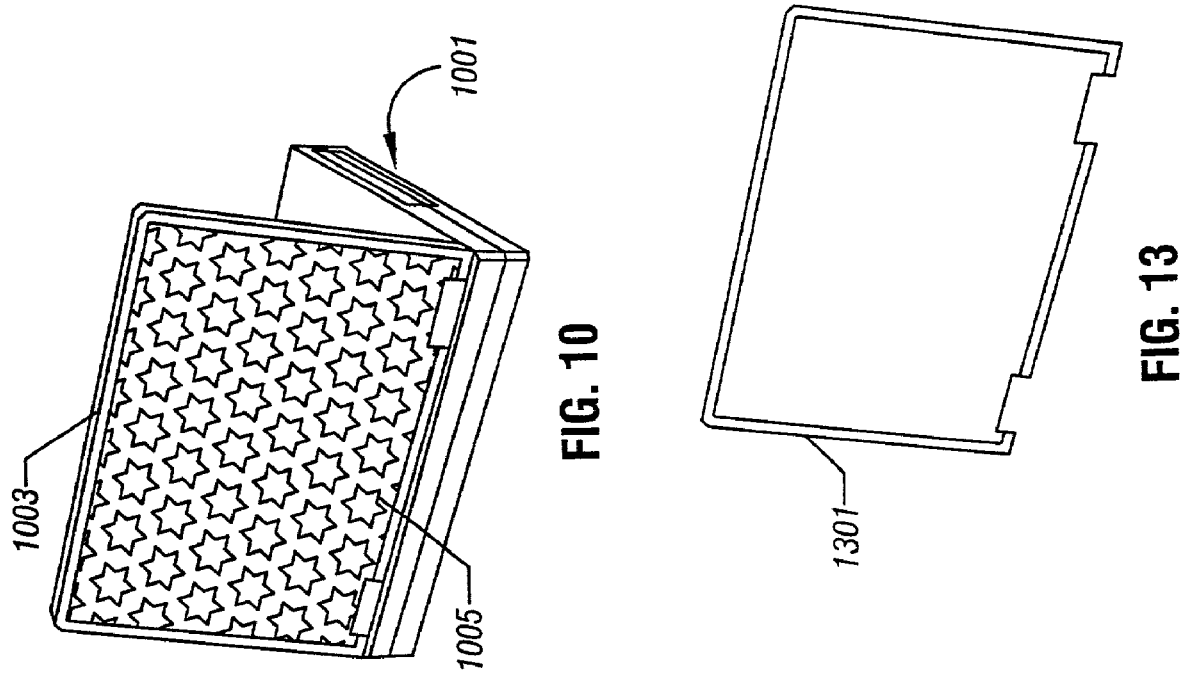

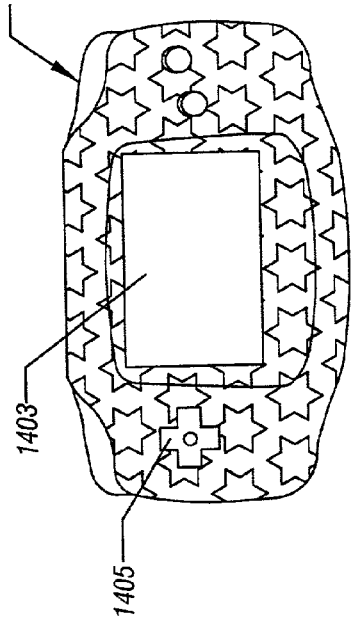
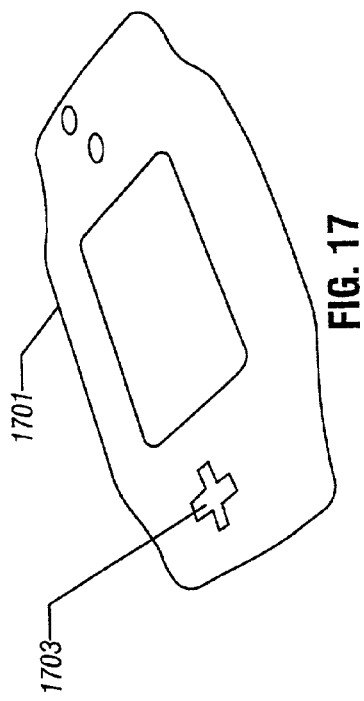
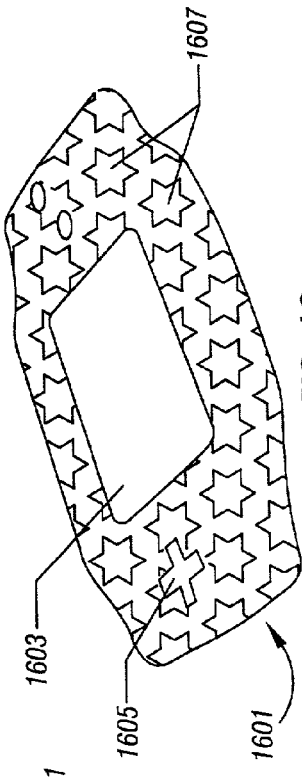
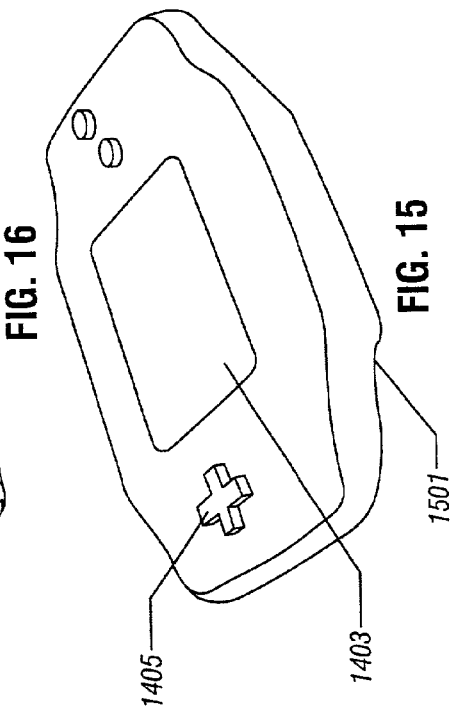

REMOVABLE CUSTOMIZABLE INSERTS AND FACEPLATE FOR ELECTRONIC DEVICES

BACKGROUND

This invention relates to the field of portable electronic.

Today electronic devices are ubiquitous. Cell phones, portable disc players and the like can be seen daily in most public places such as on the beach and in shopping malls. Many families own multiple portable devices and not infrequently have a number of the same make and model units. For example, the husband and wife may each have the same cell phone model. The children may each have similar looking portable disc players.

In addition, many of the devices look similar even if they are from different manufactures. For example, many of the portable disc players are manufactured from dark colored plastic and are generally square shaped. Many portable phones have a similar shape. This similarity of devices can and often does lead to confusion. The husband will take the wrong phone or the children will argue over who owns a particular disc player. There is therefore a need to be able to distinguish one device from another similar device.

There is also a need to distinguish a particular portable device for promotional or other purposes. For example, cellular service providers may desire to put their logos on the phones they provide to customers. A museum may wish to uniquely identify the tape players they rent to patrons.

Therefore a need exists for a way to change the look of electronic equipment to aid in identifying a particular unit from other similar units and to allow a user to give their unit a unique look.

BRIEF DESCRIPTION OF THE DRAWINGS

FIG. 1 is a plan view of a cell phone incorporating a replaceable insert and a substantially transparent faceplate in accordance with one embodiment of the present invention;

FIG. 2 is an isometric view of a cell phone base with the faceplate removed in one embodiment of the present invention;

FIG. 3 is an isometric view of a replaceable insert having an ornamental design in accordance with one embodiment of the present invention;

FIG. 4 is an isometric view of a substantially transparent faceplate in accordance with one embodiment of the present invention;

FIG. 10 is an isometric view of a laptop computer incorporating a replaceable insert and a substantially transparent faceplate in accordance with one embodiment of the present invention;

FIG. 11 is an isometric view of a base section of the top lid of the laptop computer in one embodiment of the present invention;

FIG. 12 is an isometric view of a replaceable insert in accordance with one embodiment of the present invention having an ornamental design thereon;

FIG. 13 is an isometric view of a substantially transparent faceplate for the laptop computer in accordance with one embodiment of the present invention;

FIG. 14 is a plan view of a handheld digital game incorporating a replaceable faceplate and a substantially transparent faceplate in accordance with one embodiment of the present invention;

FIG. 15 is a plan view of a base section of the handheld digital game in accordance with one embodiment of the present invention;

FIG. 16 is a plan view of a replaceable insert in accordance with one embodiment of the present invention having an ornamental design thereon; and FIG. 17 is a plan view of a substantially transparent faceplate for the handheld digital game in accordance with one embodiment of the present invention.

DETAILED DESCRIPTION

Figure 5:
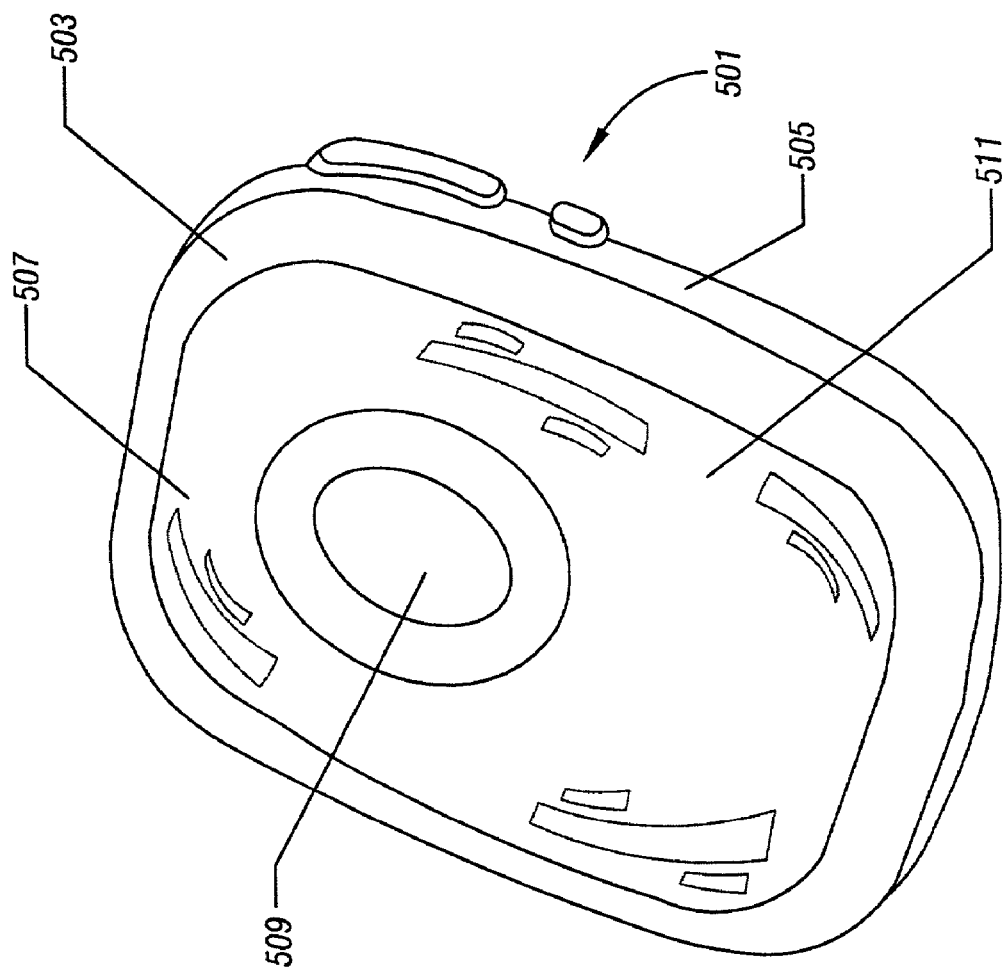
FIG. 5 is an isometric view of a digital audio player in accordance with one embodiment of the present invention.

Referring to FIG. 1, a portable cell phone 101 may display, in some embodiments, an ornamental design 103 that may be easily changed and customized by a user of the phone 101.

Referring to FIG. 2, a base section 201 of the cell phone 101 may, in some embodiments, include a plurality of operational controls of which 203, 205 and 207 may be representative. The base section 201 may also include a display 209 that may display the phone number being called and other operational data.

Referring to FIG. 3, in some embodiments, an insert 301 may incorporate a plurality of apertures of which 303, 305, 307 and 309 are representative. Apertures 303, 305 and 307 may be designed to allow the operational controls 203, 205, and 207 to be accessed from the front panel of the cell phone 101. Aperture 309 may allow the replaceable insert 301 to fit over the display 209 such that the display 209 is generally unobstructed.

Referring to FIG. 4, in some embodiments, a faceplate 401 maybe designed to be affixed to the base section 201. In one embodiment of the present invention, the faceplate 401 may be manufactured of a material that is substantially transparent such as a clear plastic or other materials.

The cell phone 101 may be constructed such that the replaceable insert 301 may be sandwiched between the base section 201 and the inside of the faceplate 401. As the faceplate 401 is substantially transparent, any ornamental design on the replaceable insert 301 may be viewable through the faceplate 401. The replaceable insert 301 may be constructed of any material that is advantageous for the printing technology used to print an ornamental design thereon.

For example, in some embodiments, a paper material may be used if an ink-jet or photocopy process is utilized to print a design on the insert 301. The paper may be fed into a printer or copier as a normal sheet of paper would. After the image has been transferred to the insert 301, the insert 301 may be formed to the size required and placed between the faceplate 401 and the base section 201. To assist in the printing process, the insert may be integrated into a full sheet of 8.5" by 11" paper with punch out tabs to assist in separating the insert 301 from the remainder of the paper.

Many of the well known graphics programs which run on home or office computers may be used to design and print a desired image on the insert 301. Alternatively, specialized programs may be designed and made available to those wishing to make custom inserts. The printing may be conveniently performed by using a home or office printer that utilizes an ink-jet, laser or other technology.

For mass produced designs, in addition to paper based materials, Mylar or other materials may be utilized to fabricate the insert should a printing technology such as silk screening or other large scale printing processes be utilized.

Another embodiment of the invention is illustrated in FIG. 5. In FIG. 5, a digital audio player 501 includes a faceplate 503 and a base 505. The faceplate 503 may be manufactured such that a viewing section 507 of the faceplate 503 is substantially transparent. A display 509 may be visible through the faceplate 503 as is a top surface 511 located under the faceplate 503. The faceplate 503 may cover substantially the entire top surface 511 of the base 505.

A "digital audio player" as used herein is an electronic device in which audio is stored digitally in non-volatile memory and converted to an analog signal for playback. Examples of non-volatile memory are solid state memory or digital audio tape.

Figure 6:
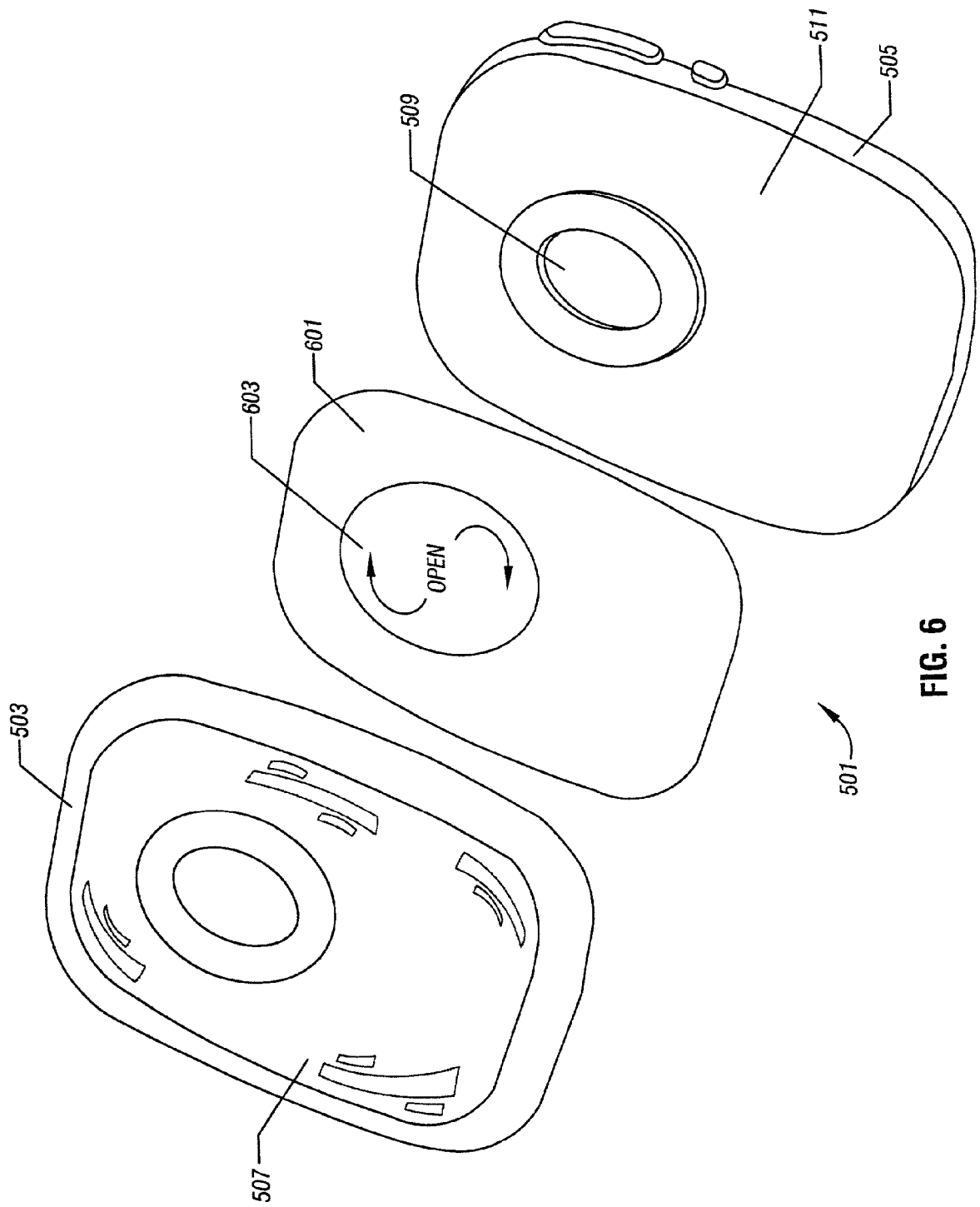
FIG. 6 is an exploded view of the digital audio player illustrated in FIG. 1.

In one embodiment of the present invention illustrated in FIG. 6, an insert 601 may fit between the top surface 511 and the underside of the faceplate 503. Insert 601 may include a display aperture 603 that may permit the display 509 to be viewed once the insert 601 is positioned on the top surface 511. In one embodiment, the player 501 may be constructed such that when the faceplate 503 is affixed to the base 505, the insert 601 may be visible through the viewing section 507.

The insert 601 may be manufactured of any convenient material but may be advantageously manufactured of a material such as paper which may retain an image when printed on by an ink jet, laser or other printer, or copied onto by a photocopier or other image transfer device. In this way, an image on the insert 601 may be visible to a user through the viewing section 507.

In some embodiments, insert 601 may be provided by the manufacturer of the digital audio player 501 with an image already printed on it or the user may be provided with blank inserts. The user may use a graphics software program to create a fanciful design, which may then be printed or copied onto a blank insert. To replace the insert 601, the faceplate 503 may be removed from the base 505 and a new insert substituted for the old insert 601. The faceplate 503 may then be affixed again to the base 505. In this manner a user may customize the appearance of the digital audio player 501 and change that appearance at any time.

Figures 7, 8:
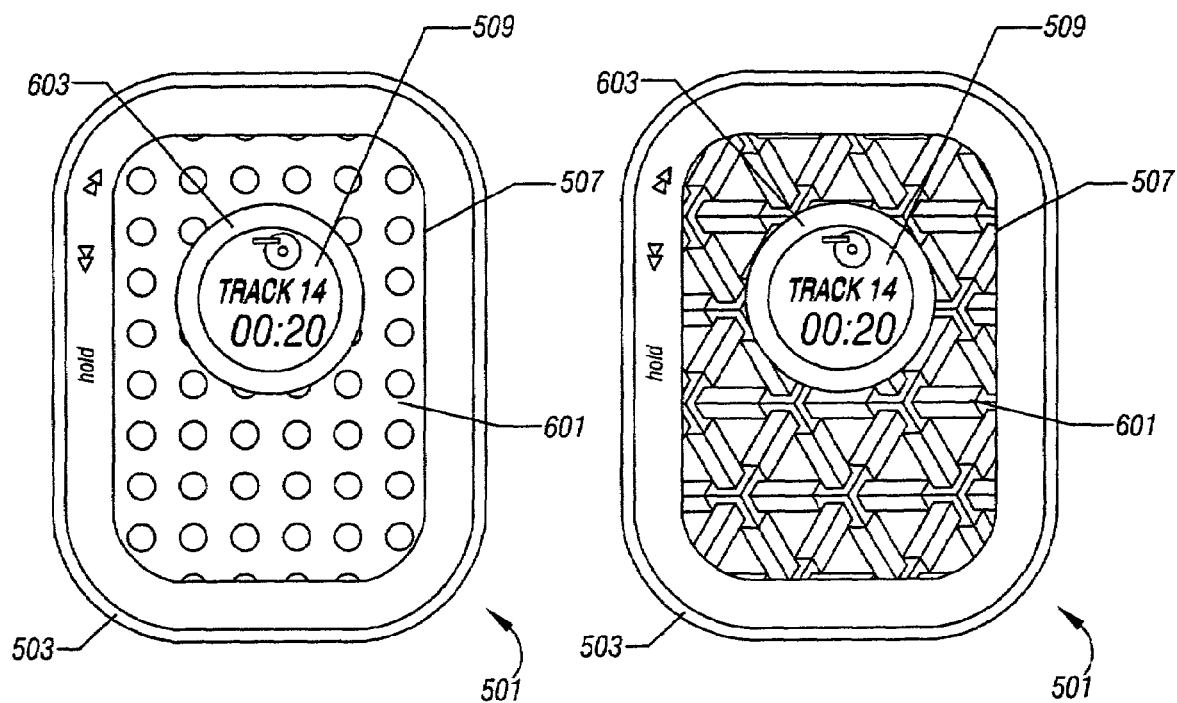
FIGS. 7–9 are plan views of a digital audio player having three different ornamental designs printed on the replaceable insert in one embodiment of the present invention.
Figure 9:
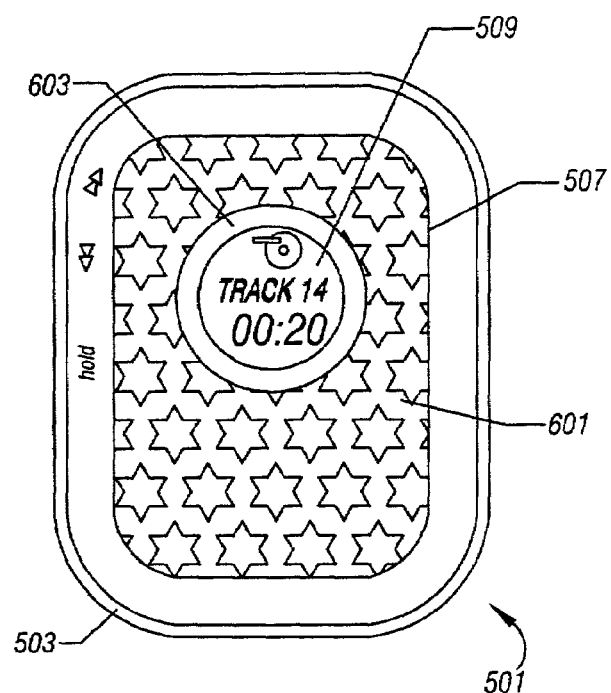

Referring to FIG. 7, in some embodiments, the insert 601 may have a pattern that may appear as rows of circles. In other embodiments the insert 601 may have a pattern that may resemble a network of interconnected beams (FIG. 8) and in still other embodiments, the insert 601 the image of a series of stars may be printed on the insert 601 (FIG. 9).

Referring to FIG. 10, in some embodiments, a laptop computer 1001 may include a display housing 1003 on top of which an ornamental design 1005 may be visible.

FIGS. 11–13 illustrate an exploded view of the laptop computer of FIG. 10. Referring to FIG. 11, a base section 1101 of the display housing 1003 may incorporate an insert retention feature 1103 according to some embodiments.

A replaceable insert 1201 (FIG. 12) in accordance with one embodiment of the present invention may be constructed such that it fits within the insert retention feature 1103 on the base section 1101. An ornamental design 1203 may be printed on the replaceable insert 1201.

Referring to FIG. 13, a faceplate 1301, in one embodiment, may be designed to fit on top of the base section 1101 and be retained thereon. To permit viewing the replaceable insert 1201, the faceplate 1301 may be advantageously constructed of a substantially transparent material in some embodiments.

As in the other embodiments, the replaceable insert 1201 may be sandwiched between the base section 1101 and the inside of the faceplate 1301. As the faceplate may be generally transparent, any ornamental design such as 1203 on the replaceable insert 1201 may be visible through the faceplate 1301. By changing the replaceable insert 1201 with another insert having a different ornamental design, the appearance of the laptop computer 1001 may be customized.

Referring to FIG. 14, in accordance with another embodiment, a handheld digital game 1401 may include a display 1403 and game controls of which 1405 may be representative.

As best illustrated in FIGS. 15–17, the handheld digital game 1401 may include a base section 1501 upon which the display 1403 and game control 1405 are located in one embodiment. Additionally, in some embodiments, a replaceable insert 1601 may be provided that may have cutout areas 1603 and 1605 designed to fit over the display 1403 and game control 1405 respectively. The insert 1601 may also have an ornamental design 1607 thereon.

Referring to FIG. 17 a faceplate 1701 for the digital game 1401 may include an opening 1703 to allow access to the game control 1405 and may be constructed of a substantially transparent material.

In some embodiments, the digital game 1401 may be designed such that the replaceable insert 1601 may be sandwiched between the base section 1501 and the inside of the faceplate 1701. The faceplate 1701 may be designed to be affixed to the base section 1501. In this manner, the ornamental design 1601 on the replaceable insert 1601 may be visible through the faceplate 1701. As with the prior described embodiments, by changing the replaceable insert 1601, the appearance of the digital game 1401 may be customized.

In all of the above described embodiments, the faceplate and ornamental insert combination cover a substantial portion of a surface of an electronic device to provide the electronic device with a unique appearance that may be easily changed. By changing the ornamental insert, a large number of unique appearances may be achieved.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An electronic device comprising:
    a base having a first surface;
    a substantially transparent removable faceplate coupled to the base and covering substantially all of the first surface; and
    a replaceable ornamental insert positionable between the removable faceplate and the first surface of the base such that a portion of the ornamental insert is viewable through the substantially transparent section, said ornamental insert punched out of a sheet of paper after a user of the electronic device has printed an ornamental design thereon.

2. The electronic device of claim 1 wherein the replaceable ornamental insert has an upper surface having an ornamental design printed thereon and the ornamental design is viewable through the substantially transparent section of the faceplate.

3. The electronic device of claim 1 wherein the base is a base portion of a portable phone.

4. The electronic device of claim 3 wherein the replaceable ornamental insert has an upper surface having an ornamental design printed thereon and the ornamental design is viewable through the substantially transparent section of the faceplate.

5. The electronic device of claim 1 wherein:
the base is a base portion of a computer; and
the replaceable ornamental insert is located between the removable faceplate and the first surface of the base such that a portion of the ornamental insert is viewable through the substantially transparent section when the removable faceplate is affixed to the base.

6. The electronic device of claim 5 wherein the replaceable ornamental insert has an upper surface having an ornamental design printed thereon and the ornamental design is viewable through the substantially transparent section of the faceplate.

7. The electronic device of claim 1 wherein the base is a base portion of a digital game player.

8. The electronic device of claim 7 wherein the replaceable ornamental insert has an upper surface having an ornamental design printed thereon and the ornamental design is viewable through the substantially transparent section of the faceplate.

9. A digital audio player comprising:
a base with a first surface, the first surface to include an electronic display;
a substantially transparent removable faceplate coupled to the base and covering substantially all of the first surface; and
a replaceable ornamental insert positionable between the removable faceplate and the first surface of the base, the replaceable ornamental insert includes a display aperture, an upper surface of the replaceable insert having an ornamental design printed thereon, a portion of the ornamental design viewable through the substantially transparent section of the faceplate.

10. The digital audio player of claim 9 wherein said replaceable ornamental insert is able to be printed on a sheet of paper and to be punched out of said paper for positioning between said removable faceplate and said first surface of said base.

11. A method comprising:
manufacturing an electronic device with a base having a first surface that includes a retention feature to accept an ornamental insert thereon;
manufacturing a substantially transparent removable faceplate to couple to the base and to cover substantially all of the first surface;
manufacturing a replaceable ornamental insert positionable between the removable faceplate and the first surface of the base; and
positioning the insert between the base and faceplate and coupling the faceplate to the base.

12. The method of claim 11 wherein manufacturing the electronic device includes manufacturing a digital audio player.

13. The method of claim 11 wherein manufacturing the electronic device includes manufacturing a digital game player.

14. The method of claim 11 wherein manufacturing the electronic device includes manufacturing a portable phone.

15. The method of claim 11 wherein manufacturing the electronic device includes manufacturing a computer.

16. An electronic device comprising:
a base having an upper surface;
an ornamental insert covering a portion of the upper surface; and
a faceplate coupled to the base and the faceplate covering all of the upper surface of the base and the faceplate having a substantially transparent section.

17. The electronic device as in claim 16 wherein the faceplate is substantially transparent.

18. The electronic device as in claim 17 wherein the ornamental insert covers substantially all of the upper surface.

19. The electronic device as in claim 17 wherein the base is a portion of a digital audio player.

20. The electronic device as in claim 17 wherein the base is a portion of a notebook computer.

* * * * *